(12) United States Patent
Morikawa

(10) Patent No.: US 6,475,036 B2
(45) Date of Patent: Nov. 5, 2002

(54) SIGNAL INPUT/OUTPUT APPARATUS

(75) Inventor: Fumio Morikawa, Misato (JP)

(73) Assignee: SMC Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/898,083

(22) Filed: Jul. 5, 2001

(65) Prior Publication Data

US 2002/0004343 A1 Jan. 10, 2002

(30) Foreign Application Priority Data

Jul. 7, 2000 (JP) ........................................ 2000-206078

(51) Int. Cl.[7] ................................................ H01R 9/26
(52) U.S. Cl. ........................................ 439/716; 439/928
(58) Field of Search ................................ 439/712, 714, 439/715, 716, 717, 928; 361/8, 26

(56) References Cited

U.S. PATENT DOCUMENTS

| | | | | |
|---|---|---|---|---|
| 5,493,194 A | * | 2/1996 | Damiano et al. | 318/575 |
| 6,028,865 A | * | 2/2000 | Rusche et al. | 370/419 |
| 6,033,257 A | * | 3/2000 | Lake et al. | 439/502 |
| 6,172,875 B1 | * | 1/2001 | Suzuki et al. | 361/729 |
| 6,291,770 B1 | * | 9/2001 | Casperson | 174/72 A |

OTHER PUBLICATIONS

Robin Abbot, "Catching the Universal Serial Bus," Electronics Today International, pp. 11–24 (date unknown).
Copy of Search Report, from counterpart British application, dated Oct. 26, 2001, is attached herewith.

* cited by examiner

Primary Examiner—Tulsidas Patel
(74) Attorney, Agent, or Firm—Paul A. Guss

(57) ABSTRACT

A signal input unit transmits detection signals derived from sensors such as switches, limit switches, or pressure switches to a programmable controller by means of serial transmission. A signal output unit transmits control signals from the programmable controller to control apparatuses such as solenoid-operated valve manifolds, indicator lamps, and buzzers by means of parallel transmission. The signal input units and the signal output units are integrated with each other into one unit and a number thereof is changeable. Further, an intermediate section and an end block are integrally assembled to the signal input units and the signal output units to construct a signal input/output apparatus.

10 Claims, 4 Drawing Sheets

SIGNAL INPUT/OUTPUT APPARATUS

BACKGROUND OF THE INVENTION

1. Field of the Invention

The present invention relates to a signal input/output apparatus. In particular, the present invention relates to a signal input/output apparatus which is provided with at least one signal input section for sending an input signal from a sensor, a switch or the like to a programmable controller by means of serial transmission and/or at least one signal output section for sending an output signal from the programmable controller to a solenoid-operated valve manifold or the like by means of parallel transmission, wherein a number of the signal input sections and the signal output sections can be changed so as not to require wiring.

2. Description of the Related Art

The conventional signal input/output apparatus comprises a signal input section and a signal output section for performing serial transmission of a signal from an input apparatus such as a sensor and a switch carried on a cylinder or an output apparatus such as a solenoid-operated valve manifold and an indicator lamp to a control unit such as a programmable controller. Respective connectors of the signal input section and the signal output section of the signal input/output apparatus is integrally arranged with a main body. Accordingly, it has been impossible to divide the signal input section and the signal output section from the main body.

With the conventional signal input/output apparatus, a control system must be large in its entirety and a space for installing the control system is increased if a sensor, a solenoid-operated valve manifold or the like to be carried on the cylinder is added because it is necessary to provide another signal input section or another signal output section. In addition, complicated wiring for the signal input section, the signal output section, and the programmable controller requires a lot of labor to maintain and inspect the signal input/output apparatus, the programmable controller or the like.

SUMMARY OF THE INVENTION

It is a general object of the present invention to provide a signal input/output apparatus which can change a number of signal input sections and signal output sections that are integrated into one unit and which can easily change a number of input apparatuses such as sensors and switches carried on a cylinder and output apparatuses such as solenoid-operated valve manifolds and indicator lamps.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1:
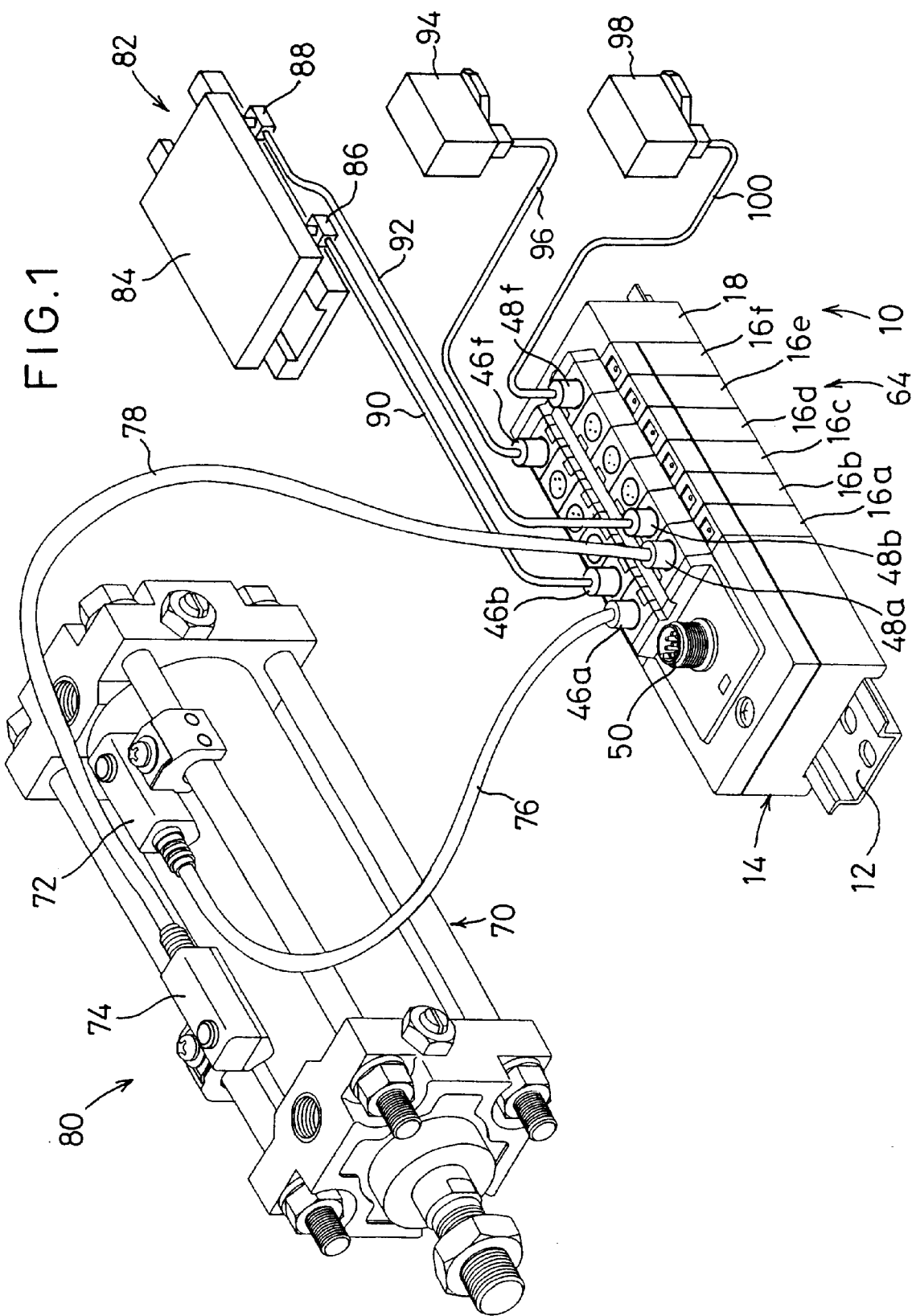
FIG. 1 shows a perspective view illustrating a schematic arrangement of a signal input system to which a signal input apparatus according to an embodiment of the present invention is applied.

FIG. 1 shows a signal input system 80 in which a signal input apparatus 10 according to the embodiment of the present invention is applied to an air cylinder, a product transport section or the like.

The signal input system 80 comprises a signal input apparatus 10, an air cylinder 70, a product transport section 82, and pressure switches 94, 98. The air cylinder 70 is provided with position-detecting sensors such as switches 72, 74 for detecting a stroke position of an unillustrated piston. The switches 72, 74 derive signals by detecting the magnetic field of a magnet that is movable integrally with the piston. The detection signals derived by the switches 72, 74 are transmitted to connectors 46a, 48a of a signal input unit 16a of the signal input apparatus 10 as described later on via signal cables 76, 78. The product transport section 82 is provided with limit switches 86, 88 for detecting a position of a workpiece 84. The limit switches 86, 88 derive signals by detecting the transported position of the workpiece 84. The detection signals derived by the limit switches 86, 88 are transmitted to connectors 46b, 48b of a signal input unit 16b via signal cables 90, 92. The pressure switches 94, 98 derive signals by detecting the pressure of an unillustrated air source and the operation pressure of an unillustrated air cylinder. The detection signals derived by the pressure switches 94, 98 are transmitted to connectors 46f, 48f of a signal input unit 16f via signal cables 96, 100.

Figure 2:
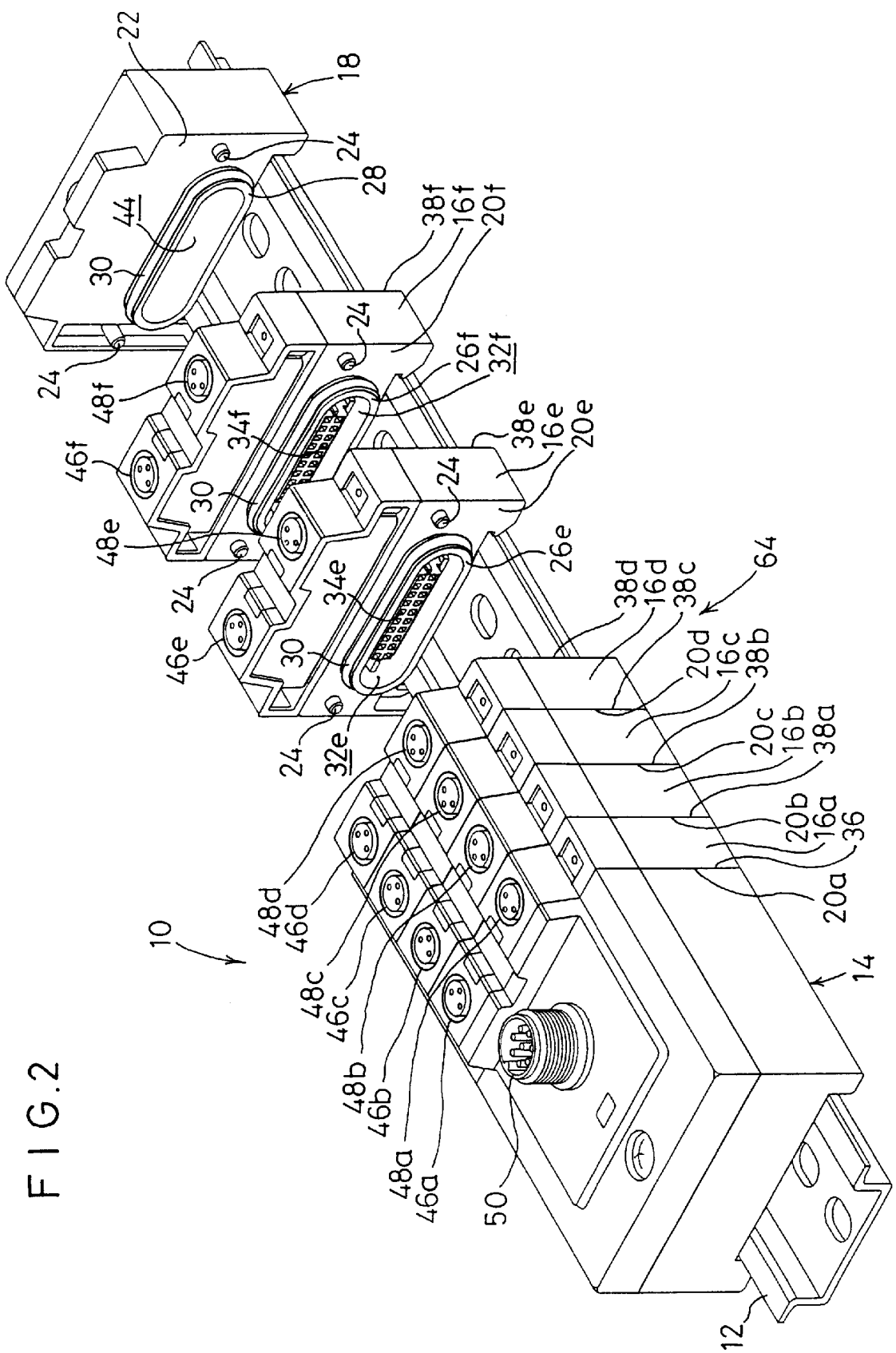
FIG. 2 shows a perspective view illustrating the arrangement of the signal input apparatus according to the embodiment of the present invention.

As shown in FIG. 2, the signal input apparatus 10 basically comprises an elongated rail 12, an intermediate section 14 which is detachably carried on the rail 12 by a fastening groove, a signal input section 64 which includes a plurality of signal input units 16a to 16f which are adjacently juxtaposed in parallel and which are detachably carried on the rail 12, and an end block 18 which is connected to an end of the signal input section 64 by the rail 12.

Each of the signal input units 16a to 16f is detachably carried on the rail 12 singly. Further, a pair of pins 24 are provided on each of joining surfaces 20a to 20f of first side surfaces of the signal input units 16a to 16f and a joining surface 22 of the end block 18. The pins 24 are engaged with holes (not shown) which are provided on each of a joining surface 36 of the intermediate section 14 and joining surfaces 38a to 38f of second side surfaces of the signal input units 16a to 16f. Being mutually positioned, the signal input units 16a to 16f are adjacently juxtaposed.

Projections 26a to 26f (only projections 26e, 26f are shown in FIG. 2), 28 are formed on the joining surfaces 20a to 20f of the first side surfaces of the signal input units 16a to 16f and the joining surface 22 of the end block 18. The projections 26a to 26f, 28 are bordered to be substantially elliptic. An O-ring 30 functioning as a sealing is installed to the outer circumferential surface of each of the projections 26a to 26f, 28. Each of the projections 26a to 26f, 28 is engaged with a recess (not shown) which is provided on each of the joining surface 36 of the intermediate section 14 and the joining surfaces 38a to 38f of the second side surfaces of the signal input units 16a to 16f.

Each of connectors 34a to 34f (only connectors 34e, 34f are shown in FIG. 2), which is provided in each of openings 32a to 32f (only openings 32e, 32f are shown in FIG. 2) of the projections 26a to 26f, is engaged with each of connectors 40, 42*a* to 42*e* (see FIG. 3) provided in each of recesses (not shown) formed on the joining surface 36 of the intermediate section 14 and the joining surfaces 38*a* to 38*e* of the second side surfaces of the signal input units 16*a* to 16*f*. It is possible to change the number of the signal input units 16*a* to 16*f* which are adjacently juxtaposed. A connector 42*f* (see FIG. 3) of the signal input unit 16*f* is engaged with an opening 44 of the projection 28 of the end block 18.

Each of the connectors 46*a* to 46*f*, 48*a* to 48*f* introduces the control signal of the input apparatus. For example, the switches 72, 74 of the air cylinder 70 are connected to the connectors 46*a*, 48*a* via the signal cables 76, 78 shown in FIG. 1. The limit switches 86, 88 of the product transport section 82 are connected to the connectors 46*b*, 48*b* via the signal cables 90, 92 shown in FIG. 1. Further, the pressure switches 94, 98 are connected to the connectors 46*f*, 48*f* via the signal cables 96, 100 shown in FIG. 1.

A connector 50 is provided on the intermediate section 14. The connector 50 inputs the detection signals introduced in the respective signal input units 16*a* to 16*f* into a control unit such as a programmable controller (not shown) by means of serial transmission.

The connectors 34*a* to 34*f*, 40, 42*a* to 42*f* (see FIG. 3), 46*a* to 46*f*, 48*a* to 48*f* are not necessarily connected with each other by the pins. The above connectors can be electrically connected with each other by signal lines.

Figure 3:
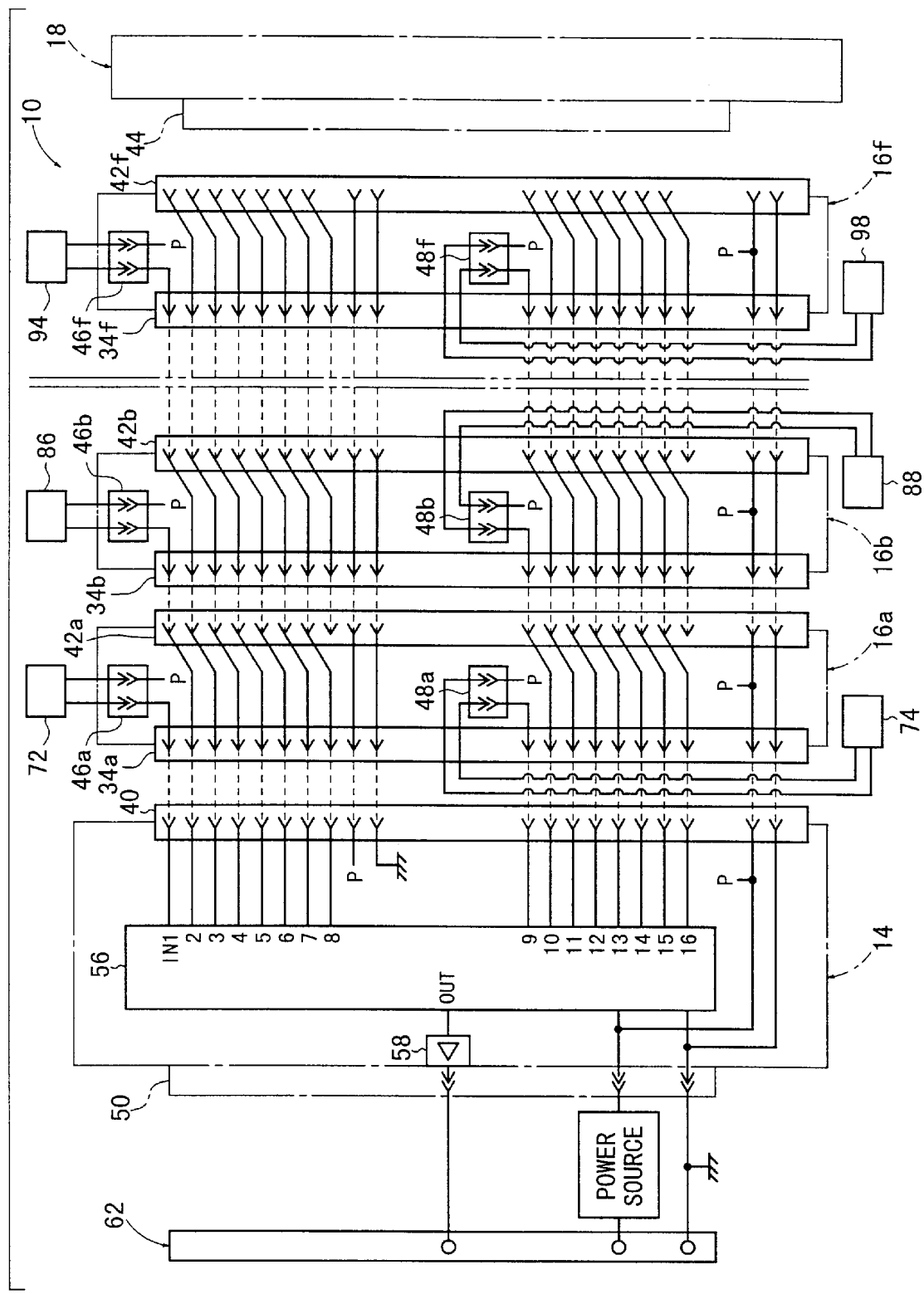
FIG. 3 shows an electric circuit diagram of the signal input apparatus shown in FIG. 1.

FIG. 3 shows an electric circuit diagram of the signal input apparatus 10 shown in FIG. 2. As shown in FIG. 1, the switches 72, 74 detect the stroke position of the air cylinder 70. The detection signals derived from the switches 72, 74 are transmitted to the connectors 46*a*, 48*a* of the signal input unit 16*a* via the signal cables 76, 78 respectively.

After transmitted to the connectors 46*a*, 48*a*, the signals pass through the connector 34*a* and are further transmitted via the connector 40 of the intermediate section 14 to a parallel/serial converter 56. At the parallel/serial converter 56, the signals are converted into serial signals. The converted serial signals pass through a communicating IC 58 and are transmitted via the connector to the programmable controller 62 respectively.

The detection signals derived from the limit switches 86, 88 and the pressure switches 94, 98 are transmitted via the signal cables 90, 92, 96, 100 to the connectors 46*b*, 48*b* of the signal input unit 16*b* and the connectors 46*f*, 48*f* of the signal input unit 16*f*.

The signals sent to the connectors 46*b*, 48*b* pass through the connectors 34*b*, 42*a*, 34*a* and enter the intermediate section 14. The signals sent to the connectors 46*f*, 48*f* pass through the connectors 34*f* to 34*a*, 42*f* to 42*a*, and enter the connector 40 of the intermediate section 14. Next, the signals are controlled in the same manner as the signals for the connectors 46*b*, 48*b* and are transmitted to the programmable controller 62.

The signal input apparatus 10 according to the embodiment of the present invention is basically constructed as described above. Its operation, function, and effect will now be explained.

In the signal input apparatus 10 shown in FIG. 2, a case will be explained at first in which the detection signals of the switches 72, 74 are derived to the signal input unit 16*a*. As stated before, the switches 72, 74 detects the stroke position of the air cylinder 70

In the signal input apparatus 10, the pins 24 are provided on the joining surface 20*a* of the first side surface of the signal input unit 16*a*. The pins 24 are fitted to the holes of the joining surface 36 of the intermediate section 14 carried on the rail 12. The projection 26*a* of the signal input unit 16*a* is fitted to the recess of the joining surface 36 of the intermediate section 14. Then, the connector 40 of the intermediate section 14 shown in FIG. 3 is engaged with the connector 34*a* of the signal input unit 16*a*.

Subsequently, the pins 24 on the joining surface 22 of the end block 18 are fitted to the holes of the joining surface 38*a* of the second side surface of the signal input unit 16*a*. The connector 42*a* of the signal input unit 16*a* is engaged with the opening 44 of the projection 28 of the end block 18. The joining surface 38*a* of the second side surface of the signal input unit 16*a* is engaged with the joining surface 22 of the end block 18.

In this case, the O-ring 30 installed to the projection 26*a* of the signal input unit 16*a* is fitted to the recess of the joining surface 36 of the intermediate section 14. Therefore, abutment surfaces of the joining surface 36 of the intermediate section 14 and the joining surface 20*a* of the first side surface of the signal input unit 16*a* are reliably sealed by the O-ring 30. Similarly, abutment surfaces of the joining surface 38*a* of the second side surface of the signal input unit 16*a* and the joining surface 22 of the end block 18 are also reliably sealed by the O-ring 30.

In FIG. 1, when the detection signals of the limit switches 86, 88 for detecting the position of the workpiece 84 on the product transport section 82 are derived to the signal input unit 16*b* and when the detection signals of the pressure switches 94, 98 are derived to the signal input unit 16*f*, then the signal input units 16*b*, 16*f* are adjacently juxtaposed with the signal input unit 16*a*. The signal input units 16*b*, 16*f* and the signal input unit 16*a* are further integrated together with the intermediate section 14 and the end block 18 into one unit, thereby constructing the signal input apparatus 10.

Each of the signal input units 16*a* to 16*f* is provided with the pair of connectors 46*a* to 46*f*, 48*a* to 48*f*. However, at least one signal input unit having a different number of connectors may be provided in a changeable fashion depending on the input apparatus to be connected to each of the signal input units 16*a* to 16*f*.

In the signal input apparatus 10 according to the embodiment of the present invention, the signal input units 16*a* to 16*f* of the signal input section 64 are integrated with each other and a number thereof may be changed in accordance with a purpose of a user. Accordingly, it is possible to conveniently change the number, a combination, and an arranged order or the like of the connectors, depending on an addition or a type of the input apparatus. Therefore, the signal input apparatus 10 is conveniently handled and a size thereof can be prevented from becoming large as far as possible.

It is possible to greatly reduce wiring since the signal input units 16*a* to 16*f* are integrated with each other into one unit. Therefore, it is further possible to reduce a production cost of the signal input apparatus 10 and to easily maintain and inspect it.

Figure 4:
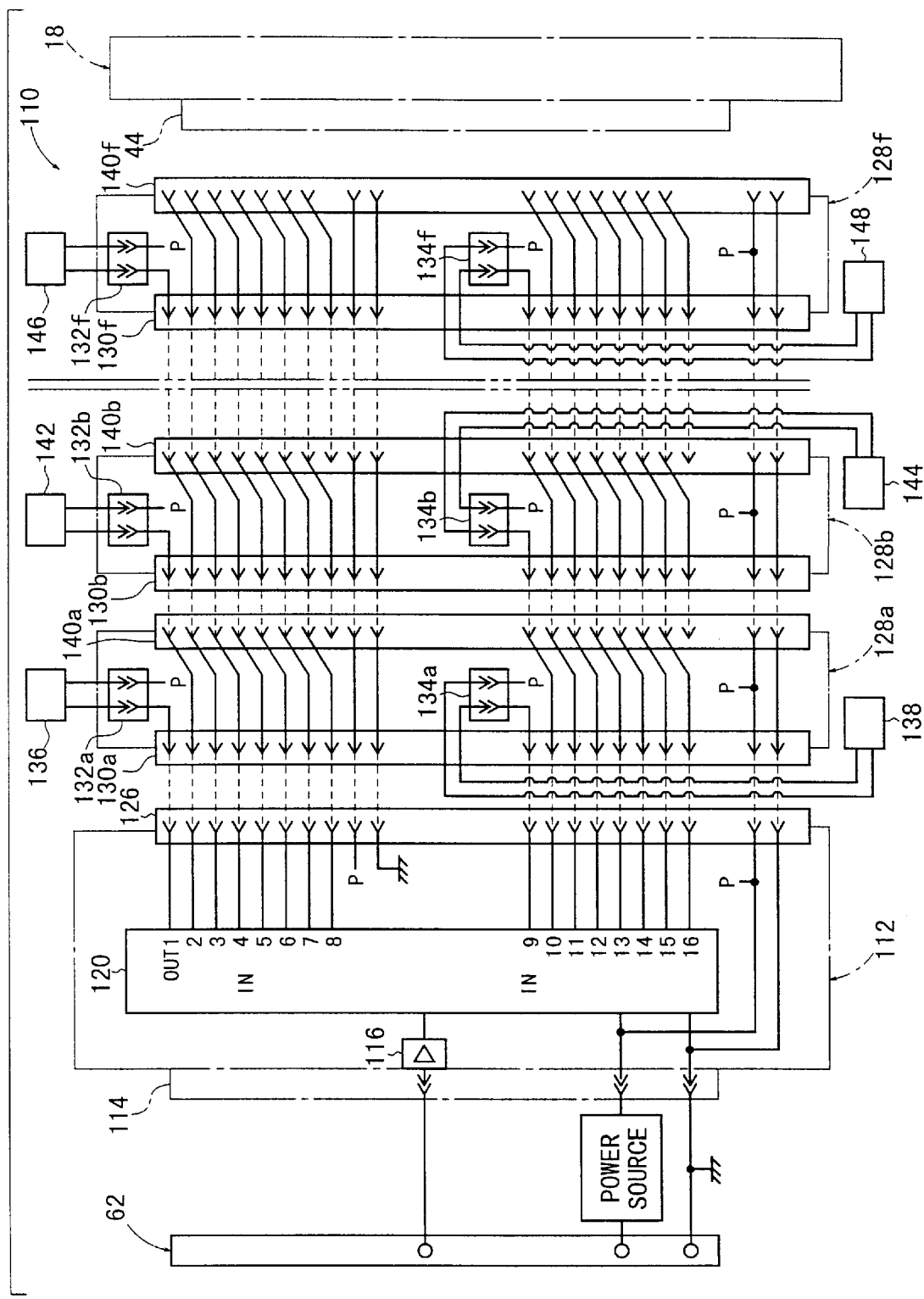
FIG. 4 shows an electric circuit diagram of a signal output apparatus according to another embodiment of the present invention.

Next, FIG. 4 shows an electric circuit diagram of a signal output apparatus 110 according to another embodiment of the present invention. The same components as that in FIG. 3 are designated by the same reference numerals, detailed explanation of which will be omitted.

After outputted from the programmable controller 62, serial signals are transmitted to a connector 114 of an intermediate section 112 of the signal output apparatus 110 and pass through a communicating IC 116. The serial signals are converted into parallel signals by a serial/parallel converter 120 and are transmitted from a connector 126 to a connector 130a of a signal output unit 128a. The parallel signals are transmitted from connectors 132a, 134a to output apparatuses such as solenoid-operated valve manifolds 136, 138 to operate respective solenoid-operated valves. The respective connectors 130a to 130f of the signal output units 128a to 128f are engaged with the connector 126 of the intermediate section 112, the connectors 140a to 140f, and the opening 44 of the end block 18.

Reference numerals 142, 144 indicate indicator lamps. The indicator lamps 142, 144 are turned on by command signals supplied via connectors 132b, 134b of a signal output unit 128b. Reference numerals 146, 148 indicate buzzers. The buzzers 146, 148 generate the buzzer sound in accordance with command signals transmitted via connectors 132f, 134f of a signal output unit 128f.

While the invention has been particularly shown and described with reference to preferred embodiments, it will be understood that variations and modifications can be effected thereto by those skilled in the art without departing from the spirit and scope of the invention as defined by the appended claims

What is claimed is:

1. A signal input/output apparatus comprising:

an intermediate section connected to a control unit;

a signal input/output section engaged with said intermediate section, for inputting/outputting a detection signal derived from a signal output apparatus or a control signal for a control apparatus, wherein said signal input/output section comprises a plurality of signal input/output units juxtaposed adjacently with each other, a number of said signal input/output units being changeable;

each of said signal input/output units comprising:

substantially elliptic openings formed on a pair of mutually opposed joining surfaces of each of said signal input/output units;

connectors disposed in said openings, said connectors being electrically connected with another one of said signal input/output units or with said intermediate section;

a seal member disposed around said elliptic opening on one of said joining surfaces;

an attaching member comprising a pin disposed on one of said joining surfaces for enabling said plurality of input/output units to be interconnected.

2. The signal input/output apparatus according to claim 1, further comprising a rail for coaxially and detachably connecting said intermediate section to said at least one signal input/output unit respectively.

3. The signal input/output apparatus according to claim 2, wherein said signal input/output units are juxtaposed adjacently with each other in parallel along said rail.

4. A signal input/output apparatus comprising:

an intermediate section connected to a control unit, said intermediate section comprising one of a parallel-to-serial signal converter or a serial-to-parallel signal converter;

a signal input/output section engaged with said intermediate section, for inputting/outputting a detection signal derived from a signal output apparatus or a control signal for a control apparatus wherein said signal input/output section is provided with a plurality of signal input/output units, a number of said signal input/output units being changeable;

each of said signal input/output units comprising:

a first connector for being electrically connected with said signal output apparatus or with said control apparatus, provided on a first side surface of the signal input/output unit; and a second connector for being electrically connected with the first connector of an adjacent input/output unit or with a connector of said intermediate section, provided on a second side surface of the signal input/output unit, wherein terminals of said first connector are electrically connected to terminals of said second connector internally of the signal input/output unit, such that the electrically connected terminals are mutually shifted in position on said first and second side surfaces.

5. The signal input/output apparatus according to claim 4, wherein said number of said signal input/output units can be changed by an attaching member.

6. The signal input/output apparatus according to claim 5, wherein said attaching member is a pin.

7. The signal input/output apparatus according to claim 4, wherein said signal input/output unit is engaged with another one of said signal input/output units by a seal member installed to a joining surface, said signal input/output unit and said another one of said signal input/output units being juxtaposed adjacently with each other.

8. The signal input/output apparatus according to claim 4, further comprising a rail for coaxially and detachably connecting said intermediate section to said at least one signal input/output unit respectively.

9. The signal input/output apparatus according to claim 8, wherein said signal input/output units are juxtaposed adjacently with each other in parallel along said rail.

10. The signal input/output apparatus according to claim 4, wherein substantially elliptic openings are formed on a pair of mutually opposed joining surfaces of said signal input/output units, and said opening is provided with a connector for being electrically connected with another one of said signal input/output units or said intermediate section, said signal input/output units and said another one of said signal input/output units being juxtaposed adjacently with each other.

* * * * *